(12) United States Patent
Sakamoto

(10) Patent No.: US 6,387,815 B2
(45) Date of Patent: *May 14, 2002

(54) METHOD OF MANUFACTURING SEMICONDUCTOR SUBSTRATE

(75) Inventor: Masaru Sakamoto, Atsugi (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/914,226

(22) Filed: Aug. 19, 1997

Related U.S. Application Data

(63) Continuation of application No. 08/642,412, filed on May 3, 1996, now abandoned, which is a continuation of application No. 08/253,164, filed on Jun. 2, 1994, now abandoned.

(30) Foreign Application Priority Data

Jun. 7, 1993 (JP) .............................. 5-160018
Jun. 2, 1994 (JP) .............................. 6-121146

(51) Int. Cl.⁷ ............................. H01L 21/302
(52) U.S. Cl. ................ 438/709; 438/710; 438/719; 438/723; 438/753; 438/755
(58) Field of Search .................. 438/710, 712, 438/709, 455, 457, 458, 719, 723, 745, 753, 756

(56) References Cited

U.S. PATENT DOCUMENTS

| | | | | |
|---|---|---|---|---|
| 4,878,957 A | * | 11/1989 | Yamaguchi et al. | 438/455 |
| 5,061,642 A | * | 10/1991 | Fujioka | |
| 5,340,435 A | * | 8/1994 | Ito et al. | |
| 5,374,329 A | * | 12/1994 | Miyawaki | 437/974 |
| 5,433,168 A | * | 7/1995 | Yonehara | |
| 5,453,394 A | * | 9/1995 | Yonehara | 437/62 |
| 5,621,239 A | * | 4/1997 | Horie et al. | |

\* cited by examiner

*Primary Examiner*—Benjamin L. Utech
*Assistant Examiner*—Duy Vu Deo
(74) *Attorney, Agent, or Firm*—Fitzpatrick, Cella, Harper & Scinto

(57) ABSTRACT

A method of manufacturing a semiconductor substrate includes the steps of laminating a first substrate having a single-crystal semiconductor region with a second substrate having an insulator region, and selectively removing the portion of the first substrate of the laminated substrates where lamination strength is weak.

2 Claims, 12 Drawing Sheets

FIG. 1(d) CROSS SECTION ALONG A-A'

FIG. 1(e) CROSS SECTION ALONG B-B'

FIG. 1(f) CROSS SECTION ALONG C-C'

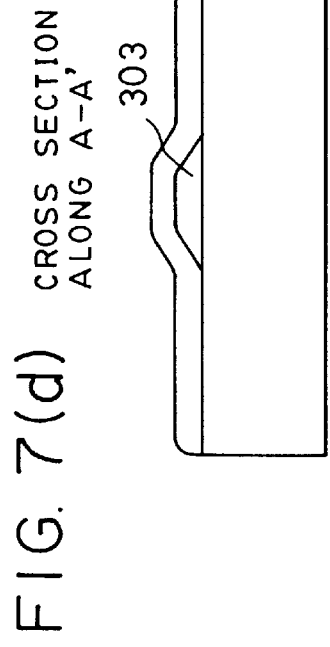
FIG. 7(a)
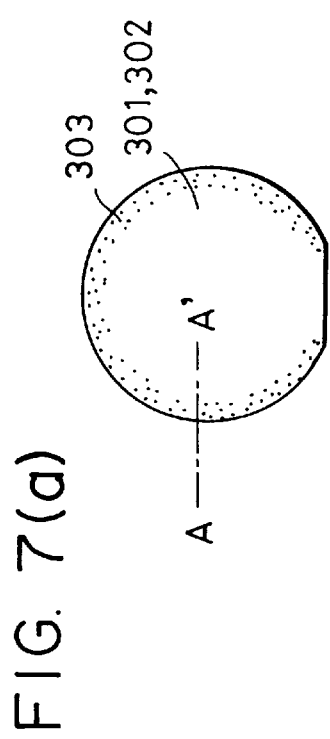
FIG. 7(d) CROSS SECTION ALONG A-A'
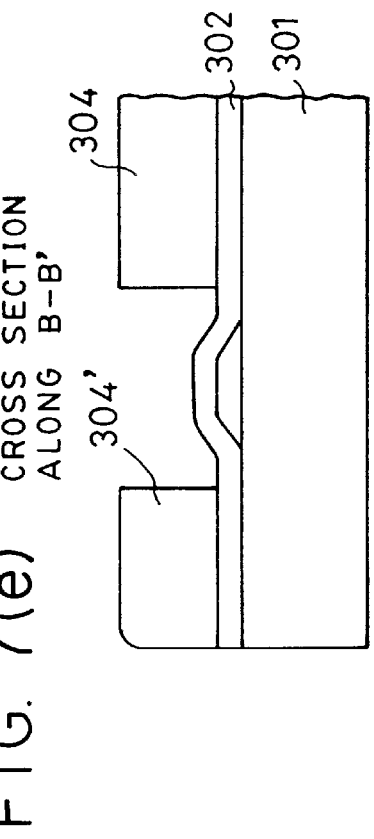
FIG. 7(b)
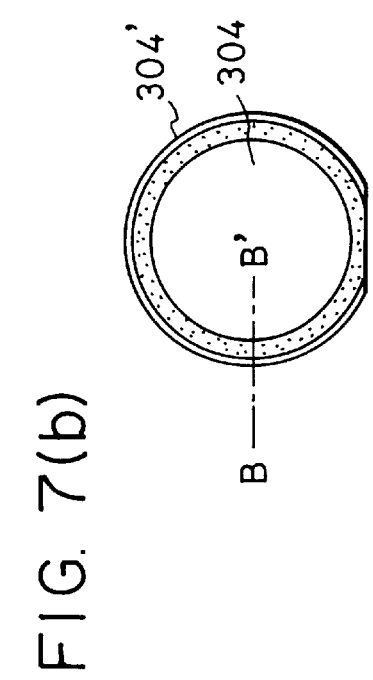
FIG. 7(e) CROSS SECTION ALONG B-B'
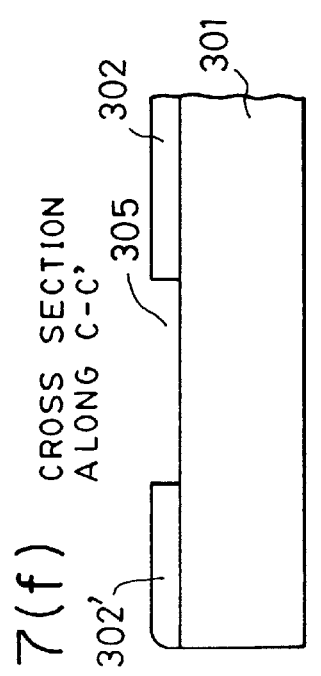
FIG. 7(c)
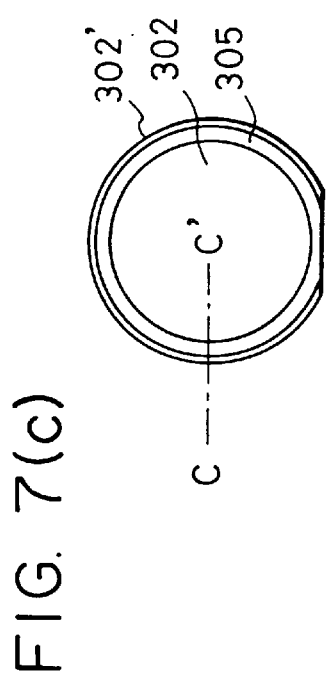
FIG. 7(f) CROSS SECTION ALONG C-C'

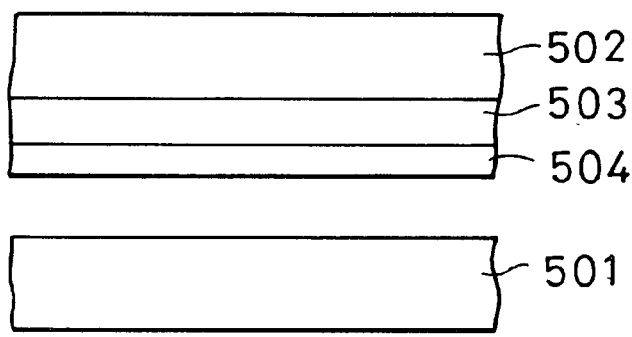
F I G. 9(a)
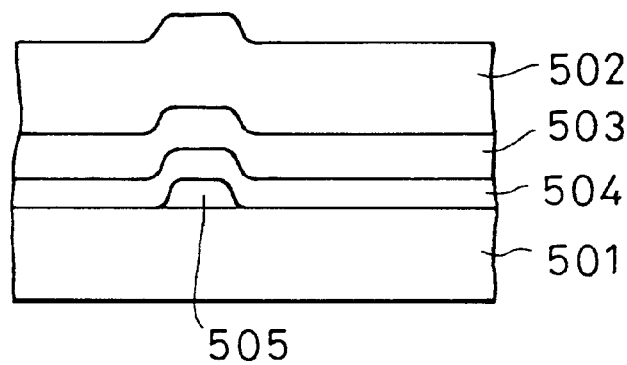
F I G. 9(b)
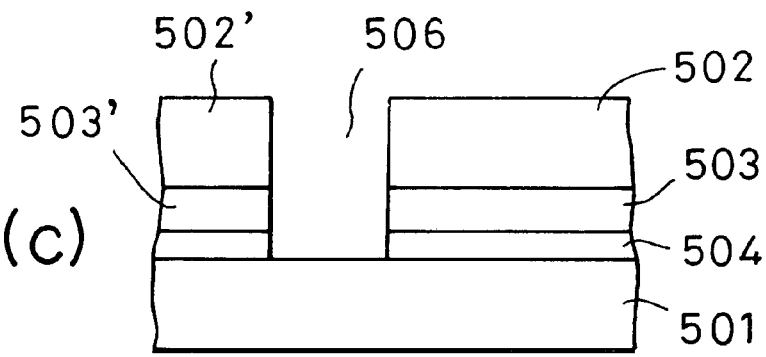
F I G. 9(c)
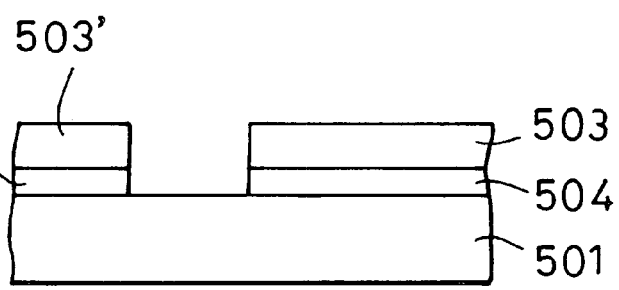
F I G. 9(d)

METHOD OF MANUFACTURING SEMICONDUCTOR SUBSTRATE

This application is a continuation of application Ser. No. 08/642,412 filed May 3, 1996, now abandoned, which is a continuation of application Ser. No. 08/253,164 filed Jun. 2, 1994, which is now abandoned.

BACKGROUND OF THE INVENTION

1. Field of the Invention

The present invention relates to a semiconductor substrate and a method of manufacturing the same. More particularly, the present invention relates to a method of manufacturing a semiconductor substrate suitable for dielectric isolation, or electronic devices or integrated circuits formed on a single-crystal semiconductor layer on an insulator.

2. Description of the Related Art

Formation of single-crystal semiconductor layers on an insulator is widely known as silicon on insulator (SOI) technology. Since devices utilizing SOI technology have numerous advantages which- cannot be achieved by bulk Si substrates from which ordinary Si integrated circuits ("IC") are produced, considerable research has been carried out. By utilizing SOI technology, the following advantages can be obtained.

① dielectric isolation is easy, and high integration is possible,
② high resistance to radiation,
③ floating capacity is reduced and high speed is possible,
④ well step can be omitted
⑤ latch up can be prevented, and
⑥ complete-depletion-type field-effect transistor due to thin films can be manufactured.

To realize the above-described numerous advantages, research has been conducted on a method of forming an SOI structure. Examples of the most advanced SOI structure are the SIMOX (Separation by Ion Implanted Oxygen) method and a substrate lamination method.

The SIMOX method is a method of forming a $SiO_2$ layer by implanting oxygen ions into an Si single-crystal substrate. Since this method conforms well to Si processes, this is the most frequently used method at the present time. However, to form a $SiO_2$ layer, it is necessary to implant oxygen ions in an amount of $10^{18}$ ions/cm$^2$ or more. The implantation time is very long, productivity cannot be said to be high, and wafer cost is high. In addition, a great amount of crystal defects may be left, and sufficient quality at which minority carrier devices can be manufactured is not achieved from an industrial point of view.

A substrate lamination method is a simple method of forming an SOI substrate by laminating an oxidized semiconductor substrate with a substrate with a similar thermal expansion coefficient. Since the surface characteristic of the substrate affects the contact characteristic, the surface characteristic needs to be improved.

In the above-described method of manufacturing a semiconductor substrate by lamination, lamination strength deteriorates due to the surface characteristic of the substrate. The surface characteristics means smoothness (RMS), degree of contaminants, particles and the like on the surface of a wafer. Although surface polishing is performed to improve the surface characteristics of the wafer, it is difficult to improve the surface characteristics over the entire surface of the wafer.

In addition, when devices are fabricated in this substrate, the substrate is peeled off from where the lamination strength is weak, damaging the device and decreasing the yield of devices (ICs). As a result, the cost of the SOI device (IC) increases.

FIGS. 6(a) and 6(b) are schematic sectional views of a region where lamination strength is weak in the prior art. FIGS. 6(a) and 6(b) show a state in which a substrate 202 is laminated on a substrate 201. As shown in FIG. 6(a), there is a portion 203 where lamination strength is weak. As shown in FIG. 6(b), the substrate 202 is destroyed in a step of manufacturing devices, forming broken pieces 204 which damage the device region.

SUMMARY OF THE INVENTION

It is an object of present invention to prevent the portion where lamination strength is weak from being peeled off, to increase the yield of devices and to reduce costs in a method of manufacturing a semiconductor substrate by a lamination method.

It is another object of present invention to provide a semiconductor substrate manufacturing method which is capable of stably manufacturing SOI substrates.

It is still another object of present invention to provide a semiconductor substrate manufacturing method comprising the steps of: laminating a plurality of substrates, and selectively removing a portion where lamination strength is weak.

A method of manufacturing a semiconductor substrate in accordance with the present invention comprises the steps of: laminating a first substrate having a single-crystal semiconductor region with a second substrate having an insulator region, and selectively removing the portion of the first substrate of the laminated substrates where lamination strength is weak, wherein the diameter of the first laminated substrate is smaller than that of the second laminated substrate.

The method of the present invention makes it possible to manufacture a semiconductor substrate in such a way that the device region is not damaged by removing a portion where lamination strength is weak before devices are fabricated thereon.

FIGS. 5(a) and 5(b) illustrate an example of the method of the present invention, also showing a state in which a first substrate 102 having a single-crystal semiconductor is laminated with an insulator, second substrate 101. In the present invention, by finding a portion 103 where lamination strength is weak before devices are fabricated thereon and removing the region to form an opening portion 104, destruction of the substrates can be prevented.

In addition, use of the method of the present invention makes it possible to improve the yield of devices above by removing beforehand a region with poor surface characteristic such as the outer peripheral portion of the wafer. When removing the outer peripheral portion of the laminated portion, it is preferable that this portion be removed in an amount of 1 mm or more.

In the method of the present invention, the portion where lamination strength is weak may be removed by etching or by mechanical polishing.

In the method of the present invention, it is effective to etch an SOI layer to a chip size before an SOI device manufacturing step. Further, it is effective to remove by etching regions (element separation portion, and the like) with a necessary SOI region left. Pattern defects resulting from film peeling are reduced sharply by removing in advance before the device is produced.

The above and further objects, aspects and novel features of the invention will more fully appear from the following detailed description when the same is read in connection with the accompanying drawings. It is to be expressly understood, however, that the drawings are for the purpose of illustration only and are not intended to limit the invention.

BRIEF DESCRIPTION OF THE DRAWINGS

FIGS. 1(a) to 1(f) illustrate an example of a method of manufacturing a semiconductor substrate in accordance with the present invention;

FIGS. 7(a) to 7(f) illustrate an example of a method of manufacturing a semiconductor substrate in accordance with the present invention;

FIGS. 9(a) to 9(d) illustrate an example of a method of c manufacturing a semiconductor substrate in accordance with the present invention;

DETAILED DESCRIPTION OF THE PREFERRED EMBODIMENTS

Figure 1A:
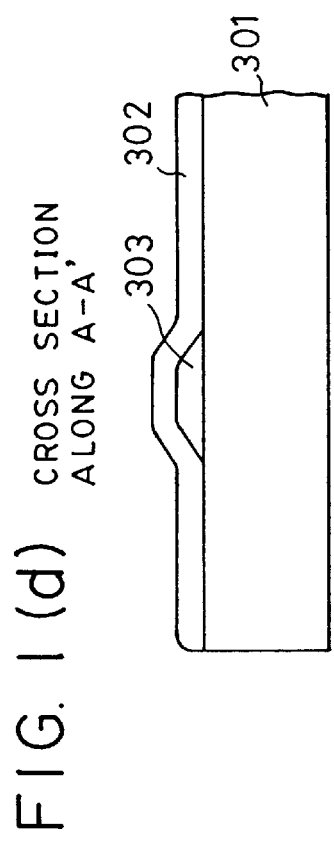
Figure 1A:
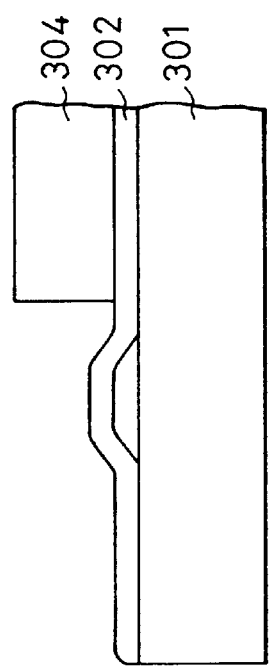
Figure 1A:
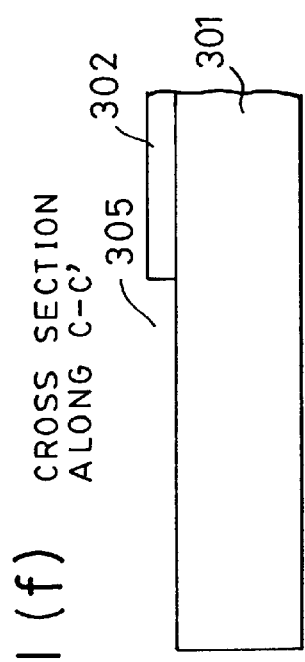
Figure 1A:
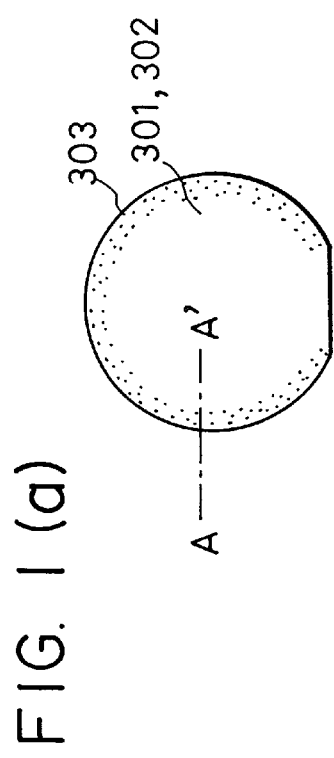
Figure 1B:
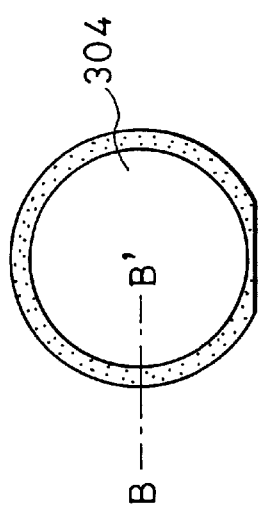
Figure 1C:
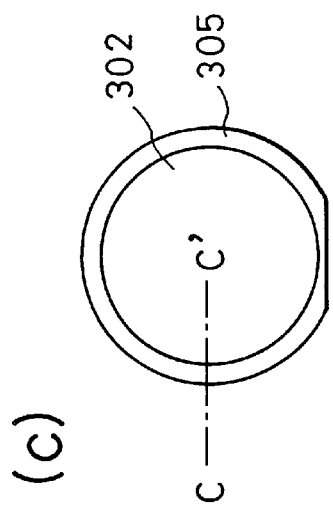

FIGS. 1(a) to 1(f) are illustrations of an example of the present invention. FIGS. 1(a) to 1(c) are plan views of a semiconductor substrate, and FIGS. 1(d) to 1(f) are sectional views along AA' in FIG. 1(a), along BB' in FIG. 1(b) and along CC' in FIG. 1(c), respectively.

As shown in FIGS. 1(a) and 1(d), a semiconductor substrate of this embodiment is produced by laminating the substrate of a single-crystal semiconductor 302 with an insulating substrate 301. Reference numeral 303 denotes a portion where lamination strength is weak in the outer peripheral portion of a wafer. The plan view of FIG. 1(a) shows a state in which the portion where lamination strength is weak is concentrated in the outer peripheral portion of the wafer.

A resist 304 is rotationally coated onto this wafer. Thereafter, only the resist in the outer peripheral portion is removed by blowing a resist-soluble solvent (e.g., acetone) onto the outer peripheral portion of the wafer (FIGS. 1(b) and 1(e)).

Next, baking is performed for 20 minutes at up to 150° C. to improve the etching-resistant characteristic of the resist 304, after which the semiconductor substrate is etched. If, for example, silicon is used as the semiconductor, and when plasma etching is performed by $CF_4$, a microwave power of 700 W, and at a pressure of 0.8 Torr, an etching rate of up to 3,000 Å/min can be obtained. If an insulating substrate 301 at this time is quartz, the etching rate is up to 30 Å/min, and the selective etching ratio can be about 100.

Thereafter, the only the outer peripheral portion of single-crystal semiconductor substrate is removed by peeling off the resist 304 by sulfuric acid or the like, so that a single-crystal semiconductor 302 having a diameter smaller than that of the insulating substrate 301 is laminated on the insulating substrate 301, shown in FIGS. 1(c) and 1(f), can be obtained.

[Second Embodiment]

Although a first semiconductor substrate and a second substrate have different major constituents in the first embodiment, the present invention may be applied in the same manner even if the same major constituent is used. In this embodiment, a substrate having silicon as a major constituent will be explained.

FIGS. 2(a) to 2(e) are flow diagrams illustrating laminating semiconductor substrates together in accordance with the present invention.

Figure 2A:
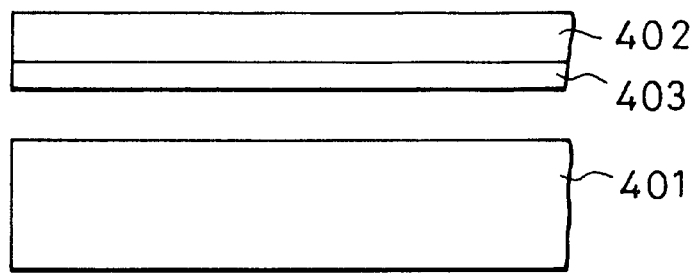
FIGS. 2(a) to 2(e) illustrate an example of a method of manufacturing a semiconductor substrate in accordance with the present invention.

In FIG. 2(a), reference numeral 401 denotes a substrate having silicon as a major constituent; reference numeral 402 denotes a single-crystal substrate of silicon; and reference numeral 403 denotes an insulating film formed on the single-crystal substrate, such as a silicon oxide film.

Figure 2B:
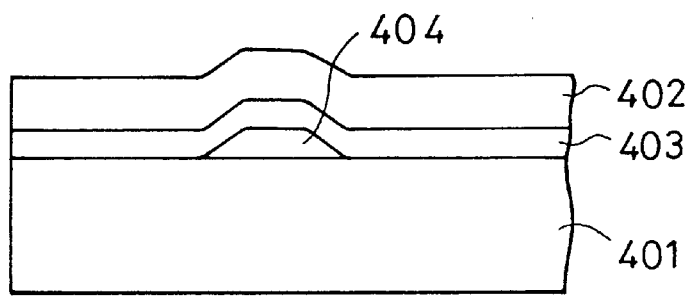
Figure 2C:
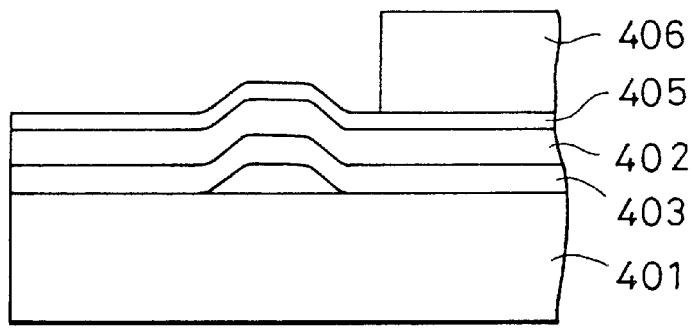

By laminating the substrates 401 and 402 with each other, a region 404 where lamination strength is weak occurs in the outer peripheral portion (FIG. 2(b)).

After lamination is performed, a thermal oxide film 405 is formed by oxidizing the single-crystal substrate. Then, a resist 406 is coated in the same way as in the first embodiment, and the resist 406 in the weak portion 404 in the outer peripheral portion of 1 mm or more is removed by an HF type solution (FIG. 2(c)).

Thereafter, the thermal oxide film 405, the silicon single-crystal substrate 402 and the insulating film 403 are removed using the resist 406 as a mask material by etching. For this etching, plasma etching may be performed in the same way as in the first embodiment. However, a case in which a TMAH type solution is used will be explained. In the case of the TMAH type, though an etching rate varies in accordance with the density thereof, a silicon etching rate of up to 8,000 Å/min can be obtained by heating commercially available 2.38% TMAH type at approximately 80° C. The etching rate of the oxide film is Å/min, and the selective ratio may assume about 5 orders of magnitude.

Figure 2D:
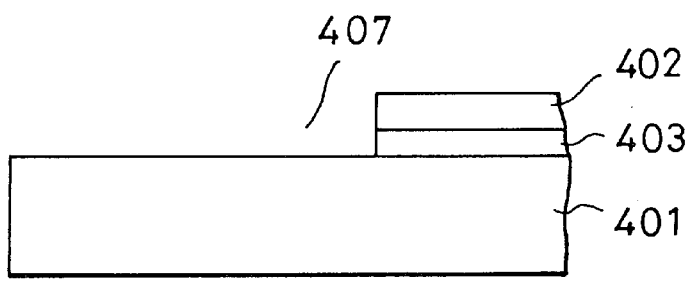

By etching this film again by an HF type solution, the insulating film 403 and the thermal oxide film 405 are etched (FIG. 2(d)).

Figure 2E:
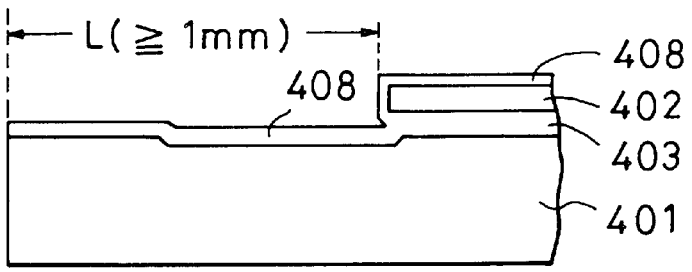
Figure 3A:
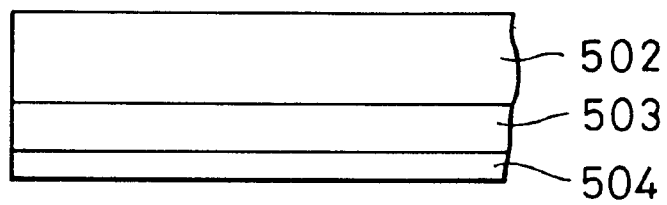
FIGS. 3(a) to 3(d) illustrate an example of a method of manufacturing a semiconductor substrate in accordance with the present invention.
Figure 3B:
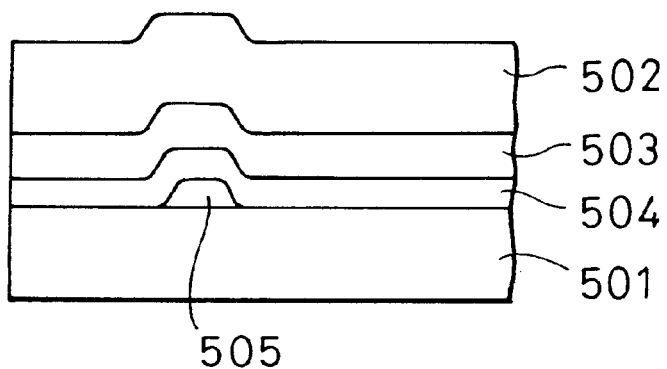
Figure 3C:
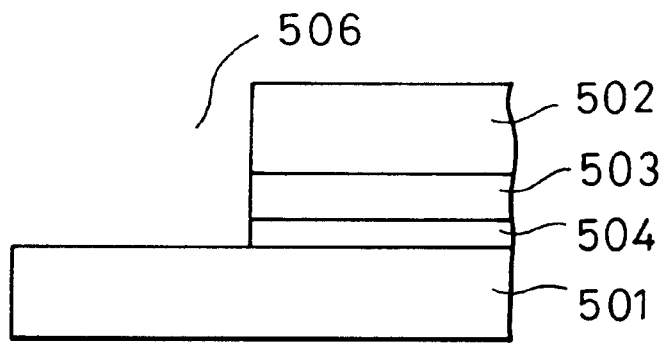
Figure 3D:
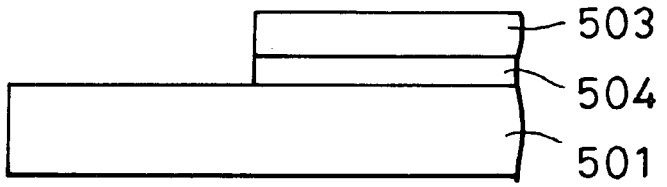

By thermally oxidizing this again, a silicon oxide film 408 is formed (FIG. 2(e)).

A silicon oxide film 408 is formed on the side wall of the single-crystal substrate and the substrate 401 having silicon as a major constituent as a result of this thermal oxidation, and the lamination strength becomes strong.

According to the above-described method of manufacturing a semiconductor substrate of the present invention, as shown in FIG. 2(e), a semiconductor substrate can be obtained such that the silicon single-crystal substrate 402, whose diameter is smaller than that of the substrate 401, is laminated with the substrate 401 having silicon as a major constituent with an insulating film provided in between them. In this embodiment, since the single-crystal substrate 402 in the outer peripheral portion where lamination strength is weak is removed beforehand, there is no adverse influence due to destruction of the film during fabrication of devices.

[Third Embodiment]

An embodiment in which porous silicon is used as a semiconductor substrate will now be explained.

FIGS. 3(*a*) to 3(*d*) are schematic views illustrating a step for manufacturing a semiconductor substrate in accordance with this embodiment. An explanation will be given below with reference to the flow diagram of FIGS. 3(*a*) to 3(*d*).

A P-type (100) single-crystal Si substrate having a thickness of 200 micron is anodized in a 50% HF solution. The current density at this time was 100 mA/cm$^2$, and the porosity speed at this time was approximately 8.4 µm/min. The whole P-type (100) Si substrate having a thickness of 200 micron was made porous in 24 min.

An Si epitaxial layer was grown to a thickness of 0.5 micron on the P-type (100) porous Si substrate by a molecular beam epitaxy (MBE) method. The deposition conditions are as follows:

Temperature: 700° C.
Pressure: 1×10$^{-9}$ Torr
Growth speed: 0.1 nm/sec

Next, the surface of the epitaxial layer was thermally oxidized to a thickness of 50 nm.

In this way, a first substrate having a porous Si 502, an Si epitaxial layer 503 and a thermal oxide film 504, shown in FIG. 3(*a*), was formed as a substrate having a single-crystal semiconductor.

Next, a molten quartz glass substrate 501, which is optically polished, was prepared as a second substrate. This substrate is stacked on the thermal oxide film 504 of the above first substrate, and they are laminated by heating at 800° C. for 5 hours in an oxygen atmosphere (FIG. 3(*b*)).

Thus, the portion other than the outer peripheral portion is masked (not shown) as in the second embodiment, and the porous Si 502, the single-crystal silicon 503 and the thermal oxide film 504 are removed by etching (FIG. 3(*c*)).

Further, when this is etched by an HF:H$_2$O$_2$, only the porous Si 502 can be removed because the selective ratio of the porous silicon to the single-crystal silicon can assume about 5 orders of magnitude (FIG. 3(*d*)).

[Fourth Embodiment]

FIGS. 7(*a*) to 7(*f*) illustrate an embodiment substantially similar to the first embodiment. Reference numerals in FIGS. 7(*a*) to 7(*f*) are the same as those explained in the first embodiment.

The difference between the first embodiment and the fourth embodiment is that a resist 304' and a single-crystal 302' are left in the outer peripheral portion because an opening 305 is formed only in the portion 303 where lamination strength is weak. As described above, in addition to the portion of the outer peripheral portion where lamination strength is weak, the present invention can be applied even when there is a portion where lamination strength is weak in the inner portion of the substrate.

[Fifth Embodiment]

FIGS. 8(*a*) to 8(*e*) illustrate an embodiment substantially similar to the second embodiment. Reference numerals in FIGS. 8(*a*) to 8(*e*) are the same as those explained in the second embodiment.

The difference between the second embodiment and the fifth embodiment is that a resist 406' and a single-crystal semiconductor 402' are left in the outer peripheral portion because an opening 407 is formed only in the portion 404 where lamination strength is weak. As described above, in addition to the portion of the outer peripheral portion where lamination strength is weak, the present invention can be applied even when there is a portion where lamination strength is weak in the inner portion of the substrate.

[Sixth Embodiment]

FIGS. 9(*a*) to 9(*d*) illustrate an embodiment substantially similar to the third embodiment. Reference numerals in FIGS. 9(*a*) to 9(*d*) are the same as those explained in the third embodiment.

The difference between the third embodiment and the sixth embodiment is that a resist (not shown) and a single-crystal semiconductor 503' are left in the outer peripheral portion because an opening 506 is formed only in the portion 505 where lamination strength is weak. As described above, in addition to the portion of the outer peripheral portion where lamination strength is weak, the present invention can be applied even when there is a portion where lamination strength is weak in the inner portion of the substrate.

[Seventh Embodiment]

Figure 10A:
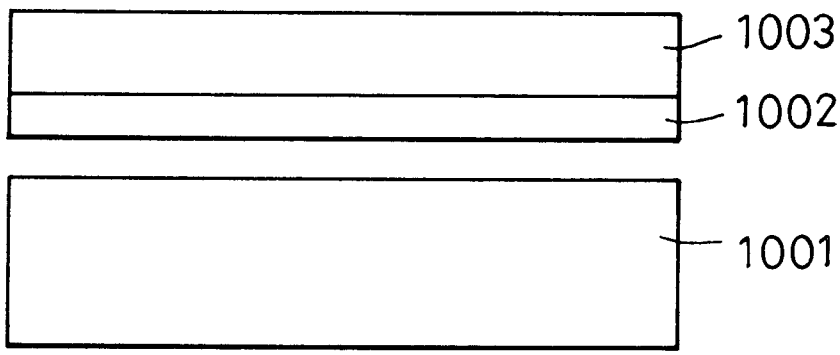
FIGS. 10(a) to 10(c) illustrate an example of a method of manufacturing a semiconductor substrate in accordance with the present invention.
Figure 10B:
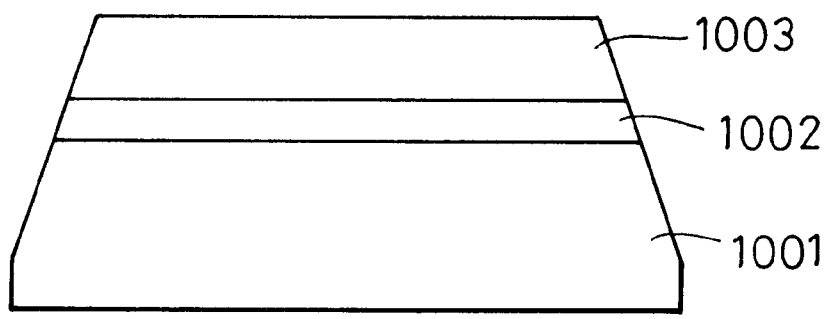
Figure 10C:
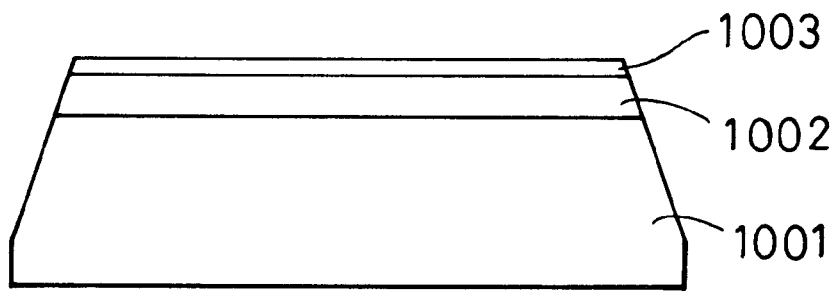

Although in the above-described embodiment an example in which an SOI layer is removed (etched) perpendicularly is described, it is possible to remove the outer peripheral portion of the wafer in a tapered form. Such an example will be explained in this embodiment. As shown in FIG. 10(*a*), reference numeral 1001 denotes an insulating substrate which is laminated with an SiO$_2$ layer 1002 formed on a single-crystal Si 1003 (FIG. 10(*a*)). Then, the outer peripheral portion where lamination strength is weak is removed in a tapered form by using a polishing machine (grinder or the like), as shown in FIG. 10(*b*). Thereafter, as shown in FIG. 10(*c*), the single-crystal Si layer is made thin. The step for providing a taper may be performed after the wafer is laminated and processed at a high temperature by taking lamination strength into consideration.

[Eighth Embodiment]

The method described in the seventh embodiment may also be applied to a case in which porous silicon is used. This method will be explained with reference to FIGS. 11(*a*) to 11(*c*).

A P$^+$ Si substrate 1005 is partially anodized, forming a porous Si layer 1004. An epitaxial Si layer 1003 is formed on the Si layer 1004 by CVD, after which a thermal oxide film (SiO$_2$) 1002 is formed on the surface of the epitaxial Si layer 1003. Thus, one of two substrates is formed. In addition to this substrate, an SiO$_2$ substrate 1001 is prepared, and both substrates are laminated together. Then, they are heated to increase the lamination strength (FIGS. 11(*a*) and 11(*b*)).

Figure 11A:
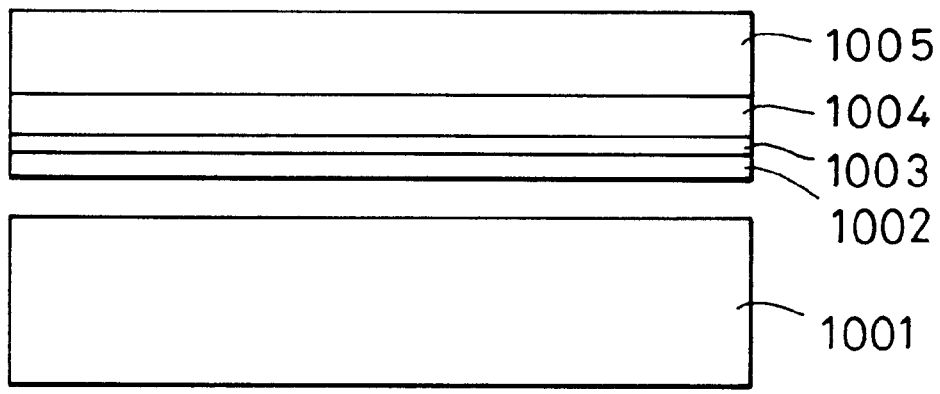
FIGS. 11(a) to 11(c) illustrate an example of a method of manufacturing a semiconductor substrate in accordance with the present invention.
Figure 11B:
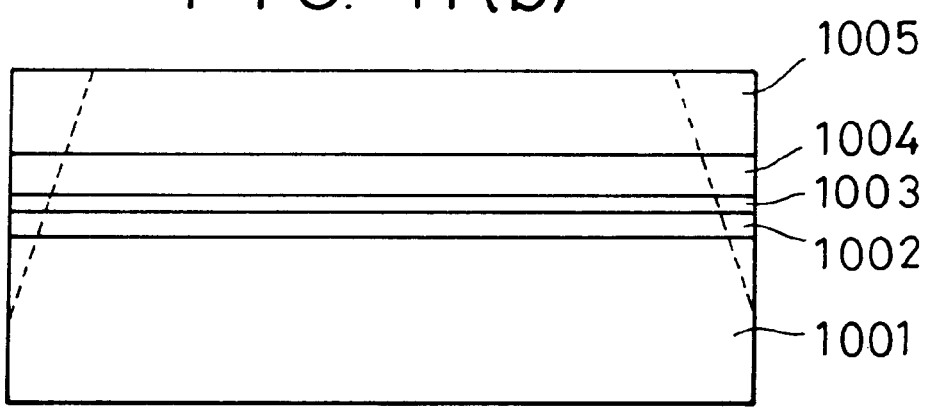
Figure 11C:
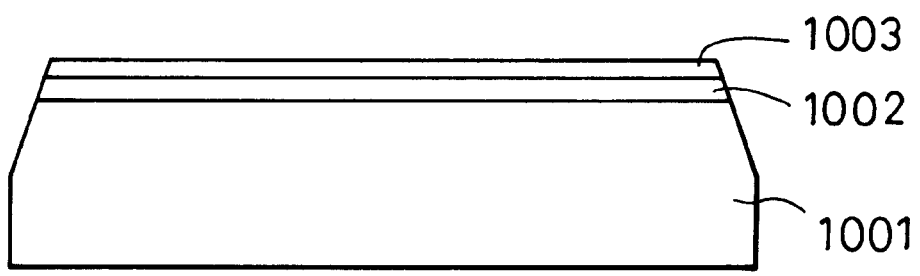

Next, the outer peripheral portion of the laminated wafer is removed in a tapered form by using a grinder (FIG. 11(*b*)).

Next, the porous layer is removed by etching by using a solution containing HF, thus forming an SOI substrate shown in FIG. 11(*c*).

When semiconductor devices, including transistors, are fabricated in the SOI substrate, no film peeling occurred in the epitaxial Si layer 1003, and ICs could be manufactured stably.

[Ninth Embodiment]

In a semiconductor substrate produced by laminating a first substrate having a single-crystal semiconductor with a second substrate having an insulating film, wherein the diameter of the first substrate having the single-crystal semiconductor of the laminated substrates is smaller than that of the second substrate. In the present invention, advantages similar to those of a different size substrate can be obtained by removing the outer peripheral portion of the wafer of the substrate having the single-crystal semiconductor by 5,000 Å or more in advance before the lamination step so that a step difference is provided even if the same size substrates are used.

Figure 12A:
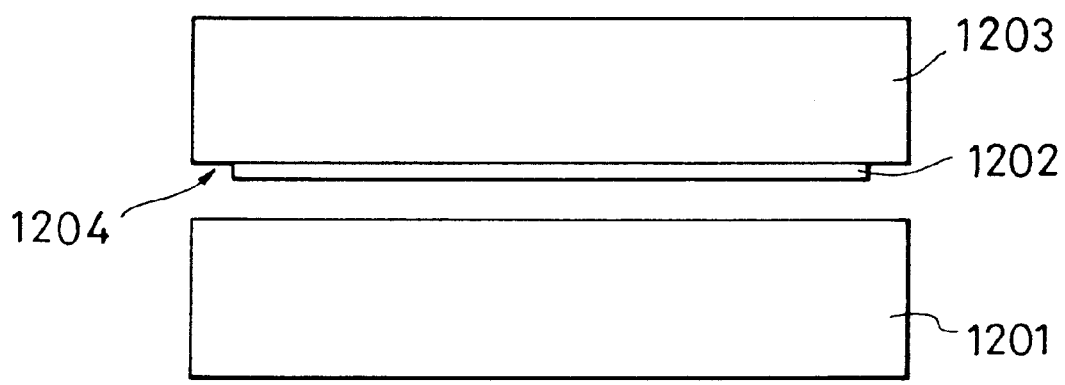
FIGS. 12(a) and 12(b) illustrate an example of a method of manufacturing a semiconductor substrate in accordance with the present invention.
Figure 12B:
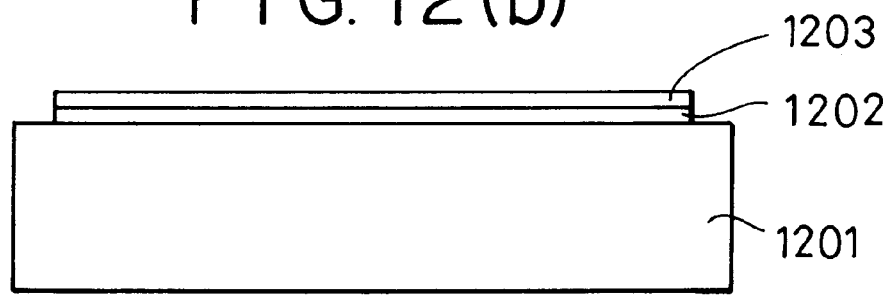

Such a method will be explained with reference to FIG. 12. An $SiO_2$ layer 1202 was formed on the surface of a single-crystal Si substrate 1203 by thermal oxidation. The $SiO_2$ layer in the end portion of the wafer is removed by 10,000 Å so that an outer peripheral removed portion 1204 was formed (FIG. 12(a)). After the substrate thus obtained is laminated with a support substrate 1201, the single-crystal Si substrate 1203 was made thin. Thus, an SOI substrate (FIG. 12(b)) having a high lamination strength could be obtained.

As described above, there is no decrease in the yield of ICs resulting from film peeling off by removing the portion of a semiconductor substrate where lamination strength is weak. In addition, a characteristic IC in which an SOI substrate is used can be provided at a low cost.

Figure 4:
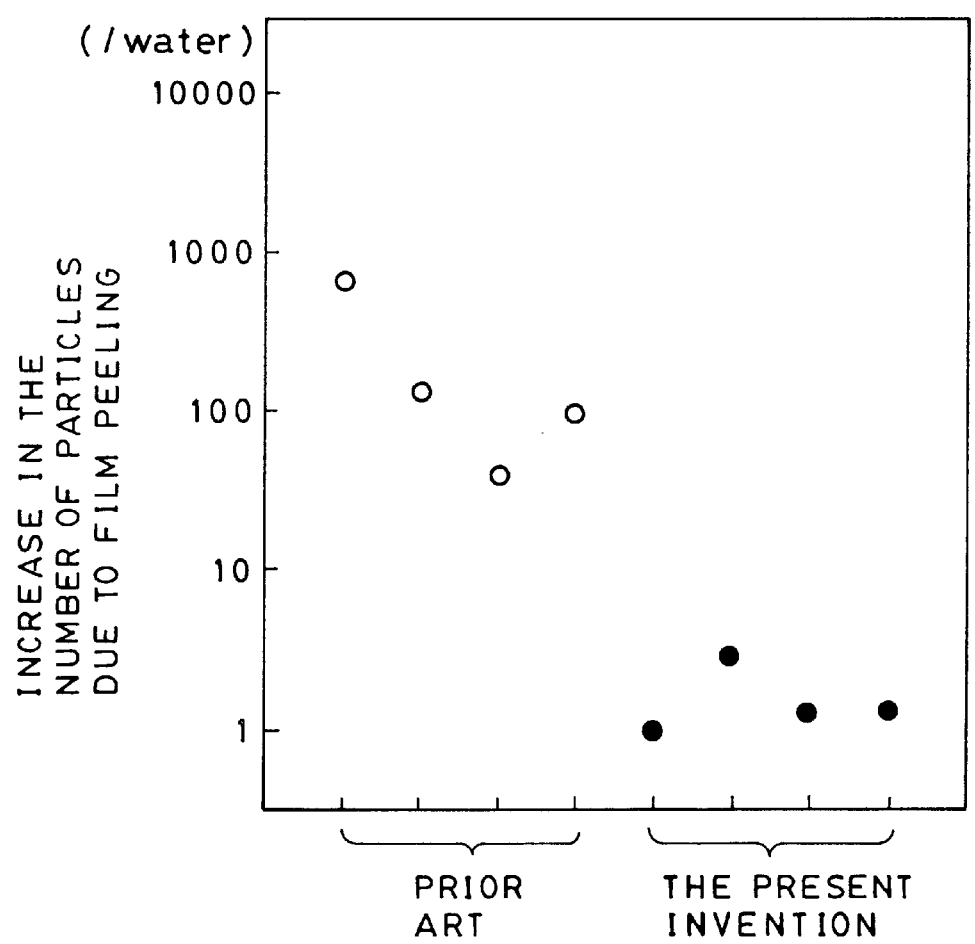
FIG. 4 is a graph showing the number of particles caused due to film peeling off when a device is produced on a substrate produced by using the present invention.
Figure 5A:
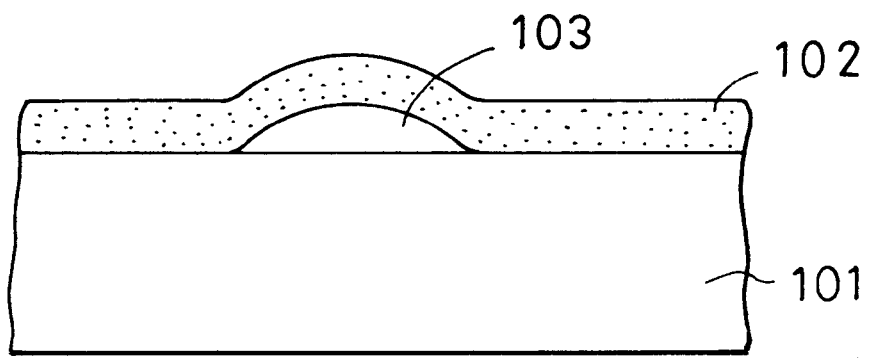
FIGS. 5(a) and 5(b) illustrate the method of the present invention.
Figure 5B:
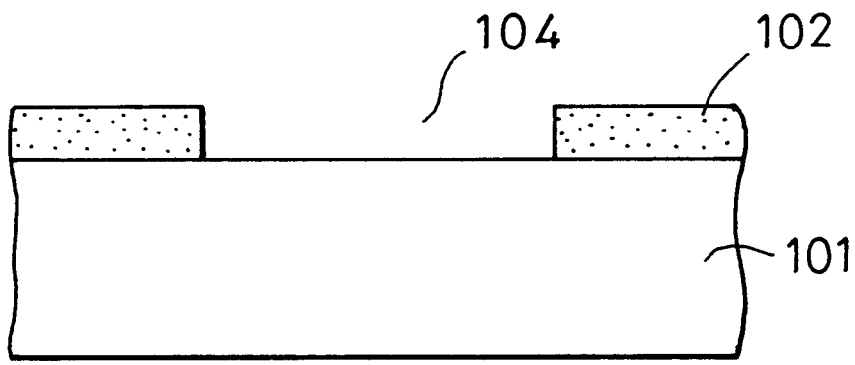
Figure 6A:
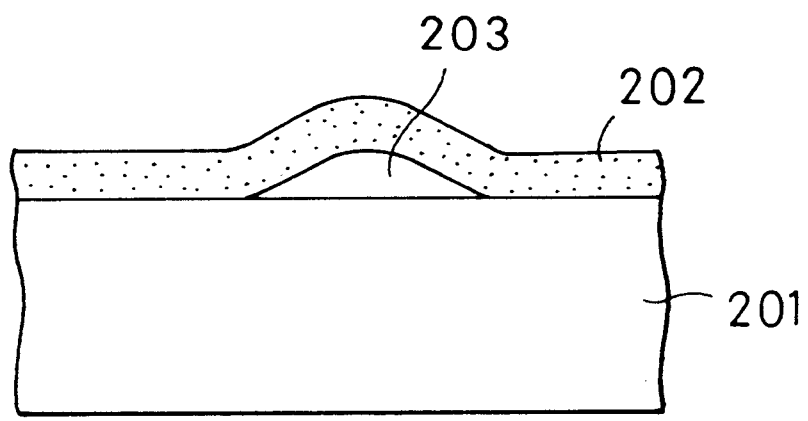
FIGS. 6(a) and 6(b) illustrate the prior art.
Figure 6B:
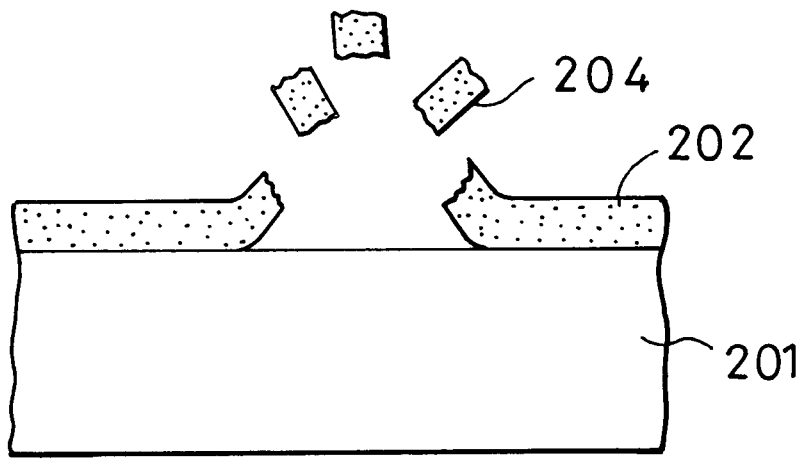
Figure 8A:
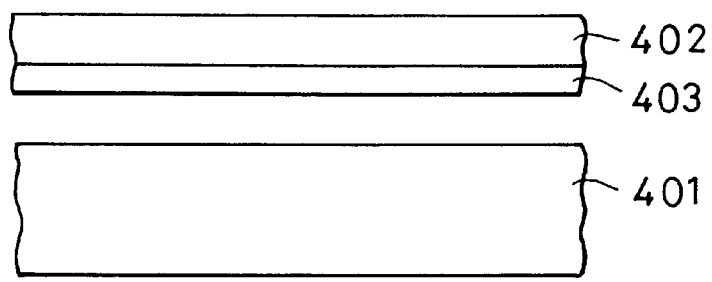
FIGS. 8(a) to 8(e) illustrate an example of a method of manufacturing a semiconductor substrate in accordance with the present invention.
Figure 8B:
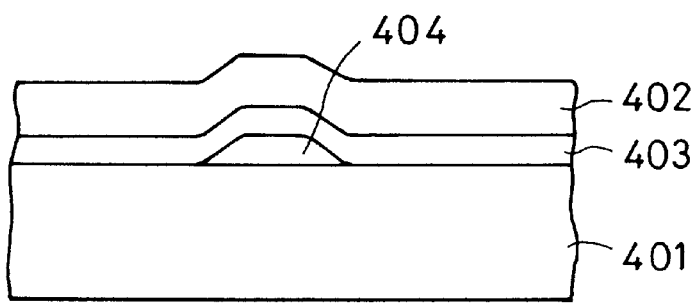
Figure 8C:
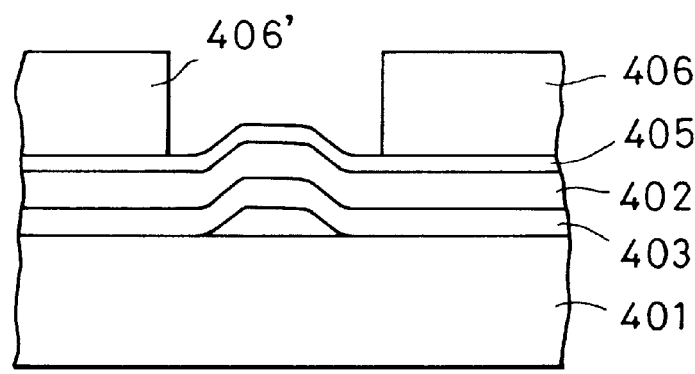
Figure 8D:
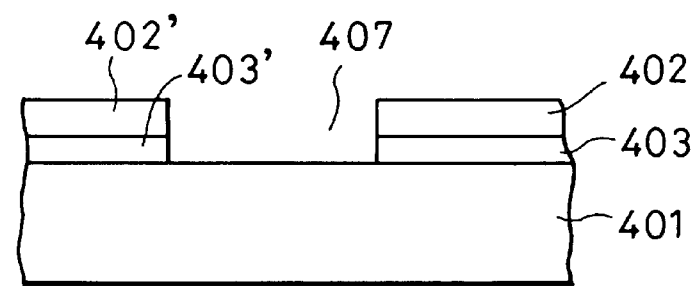
Figure 8E:
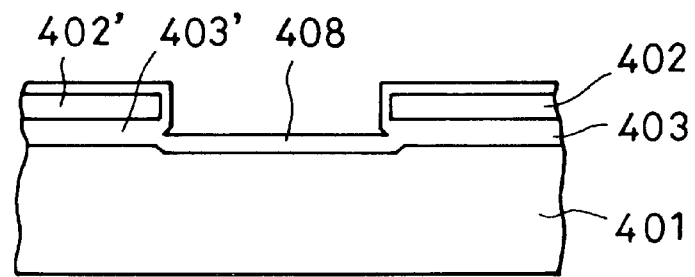

An increase in the number of particles in a device process after the present invention has been applied is shown in FIG. 4 in comparison with the prior art.

As can be seen in FIG. 4, there is almost no increase in the number of particles caused by film peeling off as a result of applying the present invention.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded the broadest interpretation, so as to encompass all such modifications and equivalent structures and functions.

What is claimed is:

1. A method of manufacturing a semiconductor substrate, comprising the steps of:

forming a laminated substrate by bonding a substrate having a single crystal silicon region and an insulating film formed thereon with a silicon substrate through said insulating film, said laminated substrate having non-contact portions where said insulating film does not contact said silicon substrate at an outer peripheral portion; and removing an outer peripheral portion of said single crystal silicon region, so as to expose an outer peripheral portion of said insulating film, and entirely removing said exposed outer peripheral portion of said insulating film, so as to expose an upper surface of an outer peripheral portion of said silicon substrate;

whereby said non-contact portions at said outer peripheral portion of said laminated substrate disappear.

2. The method of manufacturing a semiconductor substrate according to claim 1, wherein said method further comprises the step of thermally oxidizing said laminated substrate, so that a silicon oxide film is formed on said exposed upper surface of said outer peripheral portion of said silicon substrate.

* * * * *

UNITED STATES PATENT AND TRADEMARK OFFICE
CERTIFICATE OF CORRECTION

PATENT NO. : 6,387,815 B2  
DATED : May 14, 2002  
INVENTOR(S) : Masaru Sakamoto It is certified that error appears in the above-identified patent and that said Letters Patent is hereby corrected as shown below:

Column 1,
Line 23, "("IC")" should read -- ("Ics") --.

Column 3,
Line 32, "c" should be deleted.

Column 6,
Line 61, "In a" should read -- A --;
Line 66, "substrate." should read -- substrate will now be discussed. --.

Signed and Sealed this

Twenty-fifth Day of February, 2003

JAMES E. ROGAN
*Director of the United States Patent and Trademark Office*